United States Patent [19]
Schewe

[11] Patent Number: 5,128,614
[45] Date of Patent: Jul. 7, 1992

[54] COMPOUND CORE ELEMENT HAVING A PAIR OF UNIAXIAL ANISOTROPIC FERROMAGNETIC CELL COMPONENTS WITH DIFFERENT COERCIVE FIELD STRENGTH FOR A THIN FILM SENSOR

[75] Inventor: Herbert Schewe, Herzogenaurach, Fed. Rep. of Germany

[73] Assignee: Siemens Aktiengesellschaft, Berlin & Munich, Fed. Rep. of Germany

[21] Appl. No.: 693,632

[22] Filed: Apr. 30, 1991

[30] Foreign Application Priority Data

Jun. 6, 1990 [DE] Fed. Rep. of Germany ....... 4018148

[51] Int. Cl.⁵ ............................................ G01R 33/02
[52] U.S. Cl. .................... 324/249; 324/173; 324/207.15
[58] Field of Search ............... 324/249, 244, 260–262, 324/117 R; 336/200, 212, 214, 218, 232; 365/171, 172, 173; 427/47, 96; 357/4; 307/298, 402

[56] References Cited

U.S. PATENT DOCUMENTS

| | | | |
|---|---|---|---|
| 3,518,534 | 6/1970 | Bader | 324/249 |
| 3,619,772 | 11/1971 | Ellis | 324/249 |
| 3,621,382 | 11/1971 | Valet | 324/249 |
| 4,180,775 | 12/1979 | Hsieh | 324/249 |
| 4,267,510 | 5/1981 | Convertini et al. | 324/249 |
| 4,385,273 | 5/1983 | Lienhard et al. | 324/249 X |
| 4,649,755 | 3/1987 | Volz | 324/173 X |

OTHER PUBLICATIONS

Siemens Forschungs— und Entwicklungsbericht (Siemens Research and Develoment Report), vol. 15, No. 3, pp. 135–144, no month, 1986.
E. Kneller: "Ferromagnetismus" (Ferro-magnetism), Springer-Verlag, pp. 401–408, no month, 1962.
Siemens Prospectus: "SIPLUS-Drehzahlgeber mit Impulsdraehten" (SIPLUS-Speed Sensors with Pulse Wires), no date.

Primary Examiner—Kenneth A. Wieder
Assistant Examiner—W. S. Edmonds
Attorney, Agent, or Firm—Kenyon & Kenyon

[57] ABSTRACT

A magnetic-field-sensitive device includes several magnetic-field sensors. Each sensor comprises a compound element surrounded by a coil winding. Each compound element is made of two ferromagnetic cell components extending in one axial direction with uniaxial magnetic anisotropy and with different coercive field strengths. A spontaneous reversal of magnetization is produced by an external magnetic switching field only in the cell component having the lower coercive field strength. The magnetic-field sensors are combined to form a series arrangement, or array, and the coil windings and cell components of the magnetic-field sensors of the array are formed as thin-film structures on a non-magnetic substrate.

17 Claims, 5 Drawing Sheets

COMPOUND CORE ELEMENT HAVING A PAIR OF UNIAXIAL ANISOTROPIC FERROMAGNETIC CELL COMPONENTS WITH DIFFERENT COERCIVE FIELD STRENGTH FOR A THIN FILM SENSOR

BACKGROUND OF THE INVENTION

This invention relates to a device that is sensitive to magnetic fields having several magnetic field sensors, and more particularly to a device having several magnetic field sensors, where each sensor comprises core materials having different coercive field strengths and is formed on a substrate using a thin-film process.

In the publication "Siemens Research and Development Report", Volume 15 (1986) No. 3, pp. 135-144, a spontaneous switching effect in ferromagnetic wires is shown. This switching effect is based on a rapid propagation of large Barkhausen jumps. Suitable wires for this effect are the so-called "Wiegand wires", which are twisted and formed from a special ferromagnetic alloy. Special pulse wires can also promote this type of switching effect. Such a pulse wire comprises a compound element, which is formed as a wire-shaped core, and a surrounding casing. The core comprises a comparatively soft magnetic material (with a coercive field strength, $H_{c1}$, between about 0.2 A/cm and 20 A/cm). In order for an external magnetic field (e.g., a switching field) to produce a rapid, abrupt change in flux in this core and a consequent reversal in the direction of magnetization, the core must show a pronounced uniaxial magnetic anisotropy with a preferential magnetic direction lying in its longitudinal or axial direction. Furthermore, to prevent the formation of unwanted terminating domains when the core has a relatively modest length, a comparatively harder magnetic material is selected for the casing (having a coercive field strength, $H_{c2}$, of at least 30 A/cm), so as to permanently magnetize the core in this manner.

With this core structure, a switching arrangement can be assembled using an appropriate pulse wire as a part of a magnetic field sensor. The pulse wire is situated in a coil winding, which surrounds it as a further component of the magnetic field sensor. A voltage pulse is induced in the coil winding if a spontaneous magnetization reversal is produced in the core of the pulse wire by an external magnetic switching field when a specific field strength threshold is exceeded (see also E. Kneller: "Ferromagnetismus", Springer-Verlag [*Ferromagnetism*, Springer Publishing House] 1962, particularly pp. 401-408). This voltage pulse can then trigger a control or switching operation with evaluating electronics arranged downstream from the coil winding. These types of pulse wires, having diameters between 50 $\mu$m to 300 $\mu$m, can be used without additional auxiliary power as threshold triggers for a multitude of sensor tasks such as speed sensors, linear position encoders, or linear current-value limiting detectors, for measuring magnetic fields or as magnetic-field-sensitive keys.

In the Siemens prospectus entitled "SIPULS-Speed Sensors with Pulse Wires", a magnetic-field sensitive device, which has several of these magnetic-field sensors and exhibits the aforementioned characteristics, is shown. This device comprises pairs of setting and resetting magnets positioned on a master wheel coupled to a motor shaft. When the master wheel rotates, these magnets pass several stationary magnetic-field sensors. If a setting magnet approaches a magnetic-field sensor, then the switching field strength is exceeded in its corresponding pulse wire and a voltage pulse is generated in the coil winding, which is wound around the pulse wire. The pulse wire is subsequently brought into a magnetic neutral position again by the resetting field of a resetting magnet. Thus, a voltage pulse only occurs if a setting magnet approaches the pulse wire. In a known device, several such magnetic field sensors are available. Therefore, the direction of rotation can be determined from the sequence of the voltage pulses generated at the magnetic field sensors.

Manufacturing these pulse wires and the coil windings surrounding them entails considerable expenditure. Moreover, the magnetic properties, in particular the required anisotropic conditions, are difficult to reproduce and adjust with sufficient accuracy in the wires. This results in the generation of varying pulses within a magnetic-field-sensitive device by the magnetic-field sensors having the same design.

There is a need for a magnetic-field-sensitive device having sensors with similar characteristics. There is also a need for a magnet-field-sensitive device that is easily manufactured having a low expense.

SUMMARY OF THE INVENTION

These and other needs are satisfied by the present invention for a magnetic-field-sensitive device having several magnetic-field sensors. Each sensor comprises a compound element and a coil winding surrounding the compound element. The compound element comprises at least two layered ferromagnetic cell components. Each cell component extends in one axial direction and exhibits a uniaxial magnetic anisotropy with a preferential magnetic direction lying in this axial direction. The magnetic-field sensors are combined into at least one series arrangement, or array. The coil windings and layered ferromagnetic cell components of the magnetic-field sensors are formed as thin-film structures on a substrate of non-magnetic material.

The cell components are formed from materials having different coercive field strengths. Due to this difference, an external magnetic switching field causes a spontaneous magnetization reversal in the cell component having the lesser coercive field strength. This magnetization reversal generates a voltage pulse in the associated coil winding of the cell component. A first cell component is formed from a material having a coercive field strength at least five times smaller than the coercive field strength of the material of the second cell component. For example, the first cell component has a coercive field strength less than 10 A/cm and preferably less than 1 A/cm. The second cell component has a coercive field strength greater than 50 A/cm and preferably greater than 100 A/cm.

The uniaxial magnetic anisotropy of the cell components is formed by any of a variety of methods including form anisotropy, diffusion anisotropy and voltage anisotropy. Furthermore, the entire compound element is formed from a material having a magnetostriction greater than $10^{-6}$ (absolute value).

In this thin-film method of manufacture for the magnetic-field-sensitive device, the stringent requirements for an accurate structuring and repeatability of magnetic properties are satisfied. This method of manufacture also makes possible a relatively inexpensive series production. Therefore, sensors can be constructed having a large lateral resolution and defined pulse ratios, thus allowing them to represent equivalent elements within the array. Speed sensors, especially those that detect the direction of rotation, or linear position encoders can be constructed with these types of arrays.

DETAILED DESCRIPTION

Figure 1:
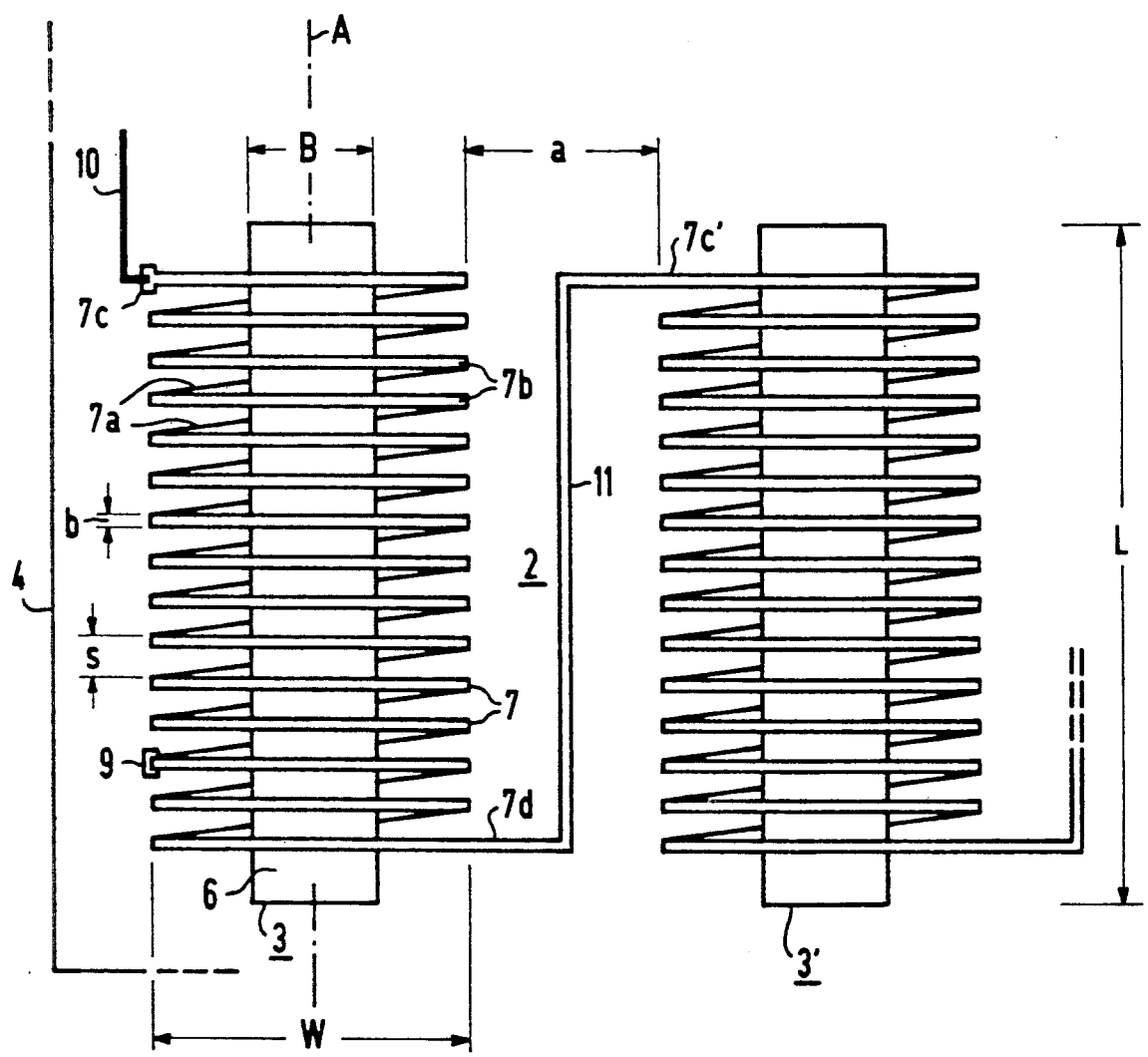
FIG. 1 is plan view of a magnetic-field-sensitive device constructed according to the present invention.

Referring to FIG. 1, a plan view of a part of a magnetic-field-sensitive device 2 constructed according to the present invention is shown. The magnetic-field-sensitive device 2 comprises a sensor device having two virtually identical magnetic-field sensors 3 and 3'. The magnetic-field sensors 3 and 3' are spaced apart by a mutual clearance a, having a magnitude between 0.1 mm and 1.0 mm, for example. The sensor device of the present invention generally has a considerably larger number of magnetic-field sensors than those depicted in FIG. 1. All of these magnetic-field sensors 3 and 3' are formed on a substrate 4 of non-magnetic material (not shown in detail) using a thin-film process well-known in the art. The magnetic-field sensors 3 and 3' form a series arrangement as an array. This array is a relatively compact arrangement of sensors, largely of the same construction, on a surface of the substrate 4.

The magnetic-field sensor 3 essentially comprises a layered compound element 6 and a coil winding 7 surrounding the element. Along the A axis, the layered compound element 6 has a length L, having a magnitude generally greater than 1 mm and less than 2 cm. The breadth B of the compound element 6, measured perpendicular to the A axis, has a magnitude between a few micrometers to 1 mm. The width W of the coil winding 7, measured perpendicular to the A axis, has a magnitude that is generally 1.5 to 3 times the breadth B. The minimum value of the width W should not fall below the quantity $W_{min} = B + 20$ μm. Thus, an appropriate large number of magnetic-field sensors can be arranged on a given surface to form an array. The length L of the compound element 6, the conductor width b of the individual windings of the coil winding 7, and the inclination per turn s determine the number of possible windings of the coil. Generally, the conductor width b has magnitude on the order of a few micrometers and the inclination per turn s is usually below 10 μm. Thus, with an inclination per turn s of 3 μm, a conductor width b of 1 μm, and a length L of 3 mm, about 1000 turns can be realized for the coil 7.

In manufacturing suitable magnetic-field sensors, such as the sensor 3, the lower conductor parts 7a of the coil 7 are initially deposited from a suitable conductor material, such as copper, silver, or gold, onto the substrate 4 using a well-known thin-film method. The lower conductor parts 7a run parallel to each other and at an angle to the axis A. The compound element 6 is a layered structure of different ferromagnetic materials and is insulated from the lower conductor parts 7a and any other parts of the coil 7. The upper conductor parts 7b are formed across the lower conductor parts 7a and the compound element 6. The upper conductor parts 7b extend more or less perpendicularly to the A axis and contact the corresponding lower conductor parts 7a in an edge area of the coil winding 7.

Contact areas of the lower conductor parts 7a are formed as relatively large-surface contact areas (contact pads) to facilitate the contact between the lower conductor parts 7a and the upper conductor parts 7b. To simplify the drawing, only one of these contact areas is shown in greater detail in FIG. 1 as reference 9. The distal end 7c of the coil winding 7 lying on the edge of the sensor device 2 is also designed as a large-surface contact area.

The electrical supply leads of downstream evaluating electronics also terminate at corresponding contact areas of the total array. Of these supply leads, only one conductor 10 is shown and is connected to the contact area 7c of the magnetic-field sensor 3. In addition, the individual magnetic-field sensors of the array are interconnected via corresponding printed conductors. In FIG. 1, only one of these connecting printed conductors 11 is shown and is connected between the connecting points 7d and 7c' of the adjacent magnetic-field sensors 3 and 3'. All of the printed conductors 11 of the array can be constructed, together with the upper conductor parts 7b, in the same operation.

Figure 2:
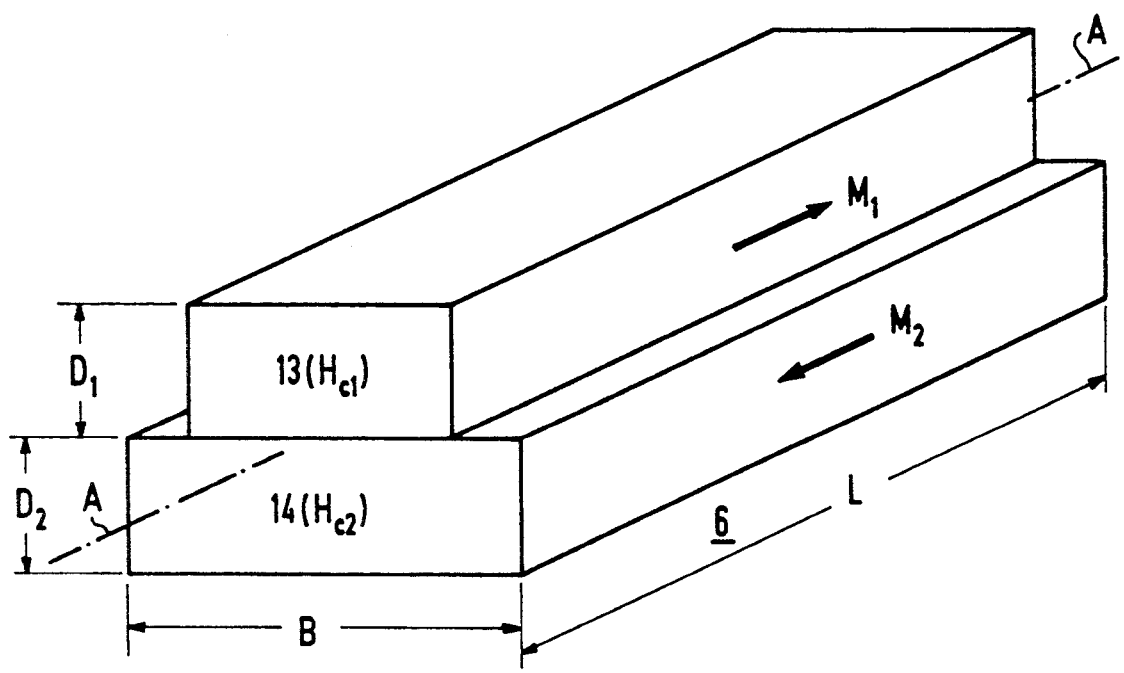
FIG. 2 is the principal structure of a layered compound element of a magnetic-field sensor of the device.

Referring to FIG. 2, an oblique view of the principal structure of the layered compound element 6 of the magnetic-field sensor 3 of FIG. 1 is shown. The compound element 6 comprises at least two layered cell components 13 and 14 arranged one above the other. Examples of the layered system of cell components 13 and 14 can be seen from the German Patent Application P 40 13 016.9 dated Apr. 24, 1990 entitled "Magnetic-Field Sensor for a Switching Arrangement with Components of Varying Coercive Field Strength". The two cell components of this layered system, magnetic layers 13 and 14, should be formed from different ferromagnetic materials. Each ferromagnetic material should feature a pronounced uniaxial magnetic anisotropy with a preferential magnetic direction lying in the A axis, and each should show varying coercive field strengths, $H_{c1}$ and $H_{c2}$ (viewed respectively in this preferential direction). In this case, the coercive field strength $H_{c1}$ of the magnetic layer 13 should be considerably less, preferably 5 times less, than the coercive field strength $H_{c2}$ of the magnetic layer 14.

Generally, soft magnetic materials having a coercive field strength $H_{c1}$ less than 10 A/cm and preferably less than 1 A/cm are suitable for the magnetic layer 13. Examples of such materials are a CoVFe alloy, with 49% by weight Co and 2% by weight V, or a NiFe alloy with about 80% by weight Ni. Also, magnetically harder materials, in particular having a coercive field strength $H_{c2}$ over 50 A/cm and preferably over 100 A/cm, should be selected for the magnetic layer 14.

Appropriate materials are, for example, CoPt, CoNi, CoFe, or NiCoFe alloys.

The magnetic layers 13 and 14 are fabricated using known methods of thin-film technology, such as vapor deposition, sputtering, or galvanic deposition. The layer thicknesses $D_1$ and $D_2$ of the magnetic layers 13 and 14, respectively, should have a magnitude between 1 $\mu$m and 10 $\mu$m. The desired uniaxial anisotropy can be established in a known manner through form anisotropy, diffusion anisotropy, and/or voltage anisotropy. If a sputtering process is implemented, advantageous and significant mechanical stresses appear. These mechanical stresses appear as a result of the warming of the magnetic layers that occurs during the sputtering process and its subsequent cooling, due to the varying thermal expansion of the magnetic layers and the underlying substrate. In addition, the voltages in a magnetic layer can also be directly influenced by the parameters of the sputtering process. Also, a tensile stress, which occurs due to a positive saturation magnetostriction of a material, and a compressive strain, which occurs due to a negative magnetostriction, can lead to a voltage anisotropy in one layer in the direction of the A axis. Therefore, materials can be advantageously selected having a saturation magnetostriction $\lambda_s$ not equal to zero. A saturation magnetostriction having a magnitude (absolute value) greater than $10^{-6}$ should be sufficient.

As indicated in FIG. 2, the magnetization $M_2$ of the highly coercive magnetic layer 14 lies in the direction of the A axis. The highly coercive layer 14 produces a stray magnetic field, which appears in the magnetically soft magnetic layer 13, parallel to its magnetization $M_1$, as seen in FIG. 2. The directions of the magnetizations $M_1$ and $M_2$ are shown in FIG. 2 by lines with arrows.

Figure 3:
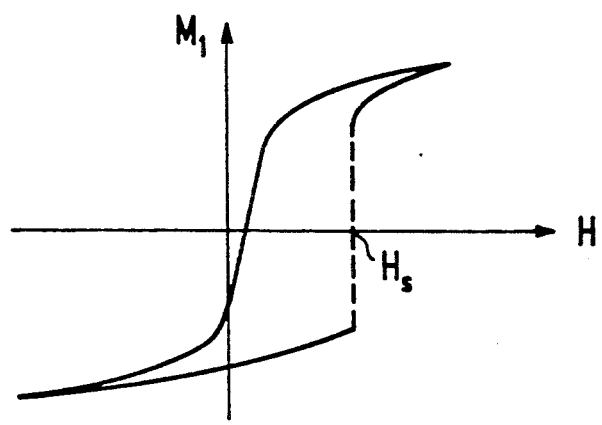
FIGS. 3 and 4 are plots of hysteresis curves of compound elements in the magnetic-field-sensitive devices of the present invention.

Referring to FIG. 3, a diagram of a hysteresis curve corresponding to the compound element 6 is shown. The field strength H of an external magnetic field acting on the compound element is plotted on the abscissa, and the magnetization $M_1$ in the magnetic layer 13 is plotted on the ordinate. To reverse the magnetization in this magnetic layer, an opposing magnetic field H (external switching field) is applied parallel to the magnetization $M_2$ in a well-known manner (e.g., see the aforementioned publication "Siemens Research and Development Report"), such that when a specific field strength threshold value $H_s$ is reached, a reverse magnetization front runs through the magnetic layer 13. This reverse magnetization front induces a corresponding voltage in the surrounding coil winding and reverses the magnetization $M_1$. The magnetic layer 13 is subsequently restored to its original magnetization by applying a reset field to the initial state shown in FIG. 2.

Figure 4:
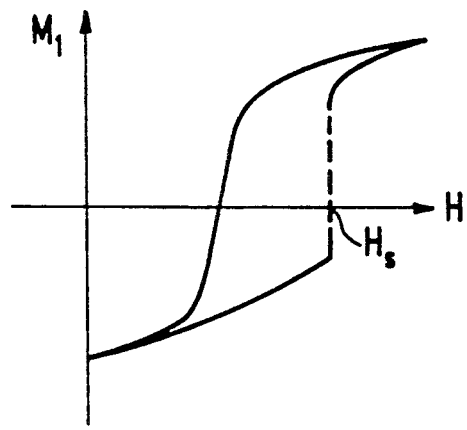

When a material is selected having a magnetic remanence $M_{r2}$ that is adequate for the magnetically hard magnetic layer 14, such an external reset field is no longer necessary. An increase in the remanence $M_{r2}$ is reflected in the magnetization conditions as a shift of the hysteresis curve in the positive direction along the abscissa. This shift of the hysterisis curve is shown in the diagrams of FIGS. 3 and 4. An application of these properties is shown in the speed sensor 16 of FIG. 5. In this speed sensor, only bar magnets 17 having a polarity N (magnetic north) are needed to generate a pulse voltage U in the sensor device 2. However, the switching field $H_s$ must be increased accordingly relative to the magnetization conditions shown in FIG. 3.

Figure 5:
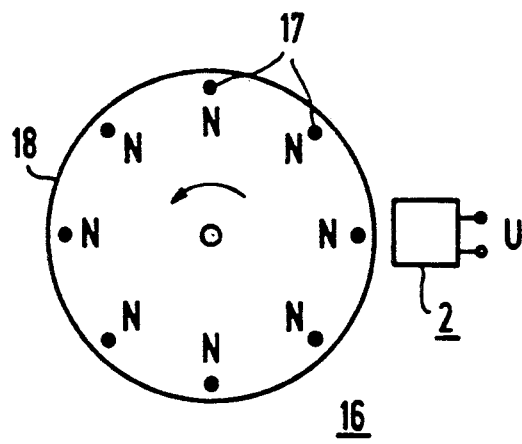
FIG. 5 is the principal structure of a speed sensor which includes the magnetic-field-sensitive device of the present invention.

The design of the speed sensor 16 of FIG. 5 is based on known specific embodiments (e.g., see the aforementioned publication "Siemens Research and Development Report"). The speed sensor comprises a non-magnetic holding device 18 which can be described as a master wheel having a circular cross-section. The holding device 18 is secured to a rotating engine shaft, for example, and serves to accommodate the bar magnets 17. Viewed in the circumferential direction, these bar magnets 17 are evenly distributed around the outer edge of the holding device 18. During operation, the bar magnets 17 pass the stationary sensor device 2. At this point, the bar magnets 17 cause the magnetic reversals in the magnetic layers 13 of their respective magnetic-field sensors 3, 3' resulting in a pulse voltage U in the associated coil windings 7.

Constructing the speed sensor 16 in this manner with magnets 17 of the same polarity ensures a high angular resolution. A further advantage is that mounting the magnets 17 along the periphery of the holding device is easier to manufacture. After assembly, these magnets 17 can be magnetized in one direction, in one operation sequence. Therefore, the danger of having a defective arrangement of many alternating magnets, which is required in known speed sensors, is eliminated using the device of the present invention.

An important simplification in the manufacture of the speed sensor 16 can also be obtained. First, the unipolar magnets 17 are applied as hard magnetic layers by sputtering, plasma spraying, or galvanic deposition onto a plastic or ceramic film. Then the magnets 17 are etched to predetermined dimensions with a high degree of accuracy using known microstructure techniques. Finally, the magnets 17 are affixed to a cylindrical sleeve. For this embodiment of the invention, layers of CoPt, CoNi, CoFeNi, FeSmTi, CoSm or NdFeB are suitable as hard magnetic materials.

Figure 6:
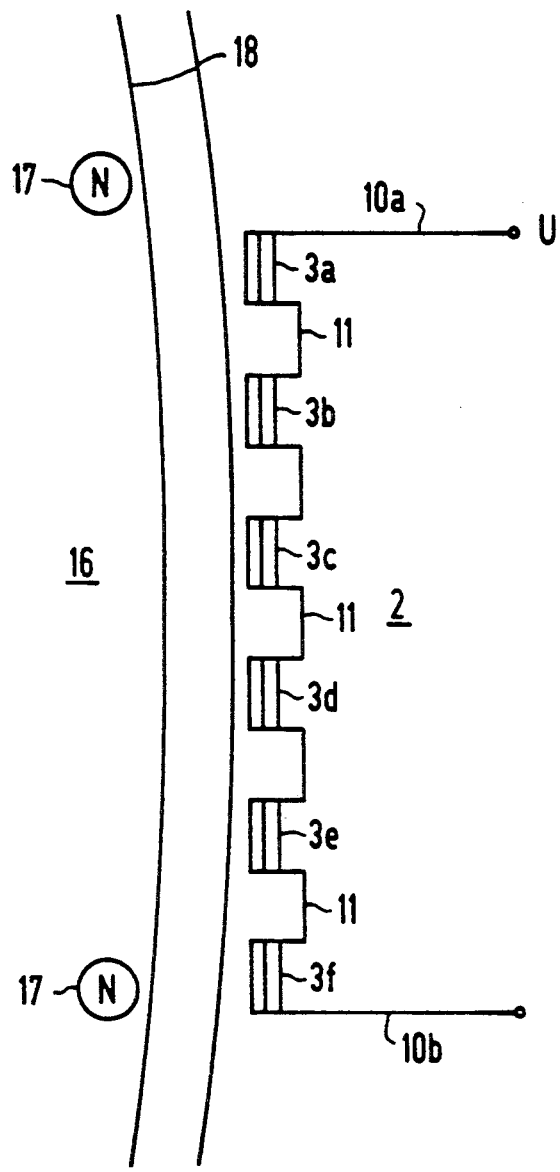
FIG. 6 is an enlarged view of a portion of the speed sensor of FIG. 5.

The angular resolution of the speed sensor can be increased as compared to known speed sensors through the use of several magnetic-field sensors within one sensor device. An enlarged portion of the speed sensor of FIG. 5 is shown in FIG. 6 with a sensor device 2. For clarity, only two magnets 17 having the same polarity N are shown in FIG. 6 along the outer edge of the holding device 18. The sensor device 2 comprises six magnetic-field sensors 3a to 3f, which are assumed to have a hysteresis curve as shown in FIG. 4. In this embodiment, the magnetic-field sensors 3a to 3f are coupled in series by printed conductors 11. The generated pulse voltage U of the sensor device is tapped at supply leads 10a and 10b at the two outer magnetic-field sensors 3a and 3f. According to the present invention, it is also possible to develop a sensor device having several magnetic-field sensors, such that the pulse voltages generated at each sensor are tapped individually and summed in a known summing network.

Figure 7:
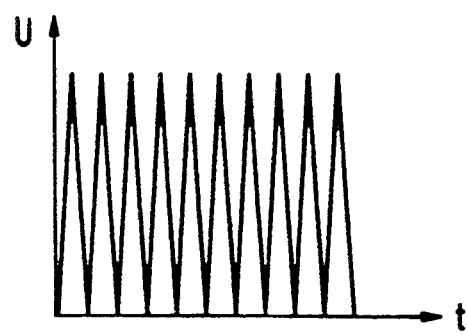
FIG. 7 is a plot of the pulse voltages generated with the speed sensor of FIGS. 5 and 6.

Referring to FIG. 7, a series of pulses of the generated pulse voltage U in the speed sensor 16 is shown with respect to time. The diagram clearly shows the resolution of the summation voltage which is an advantage of the sensor device of the present invention.

In an alternative embodiment, it is also possible to use magnetic-field sensors exhibiting a hysteresis curve as shown in FIG. 3. In this case, however, the resolution of the summation voltage is smaller by a factor of two. This is occurs as a result of doubling the cycle duration, since its always necessary to have pairs of switching magnets having different polarity.

Figure 8:
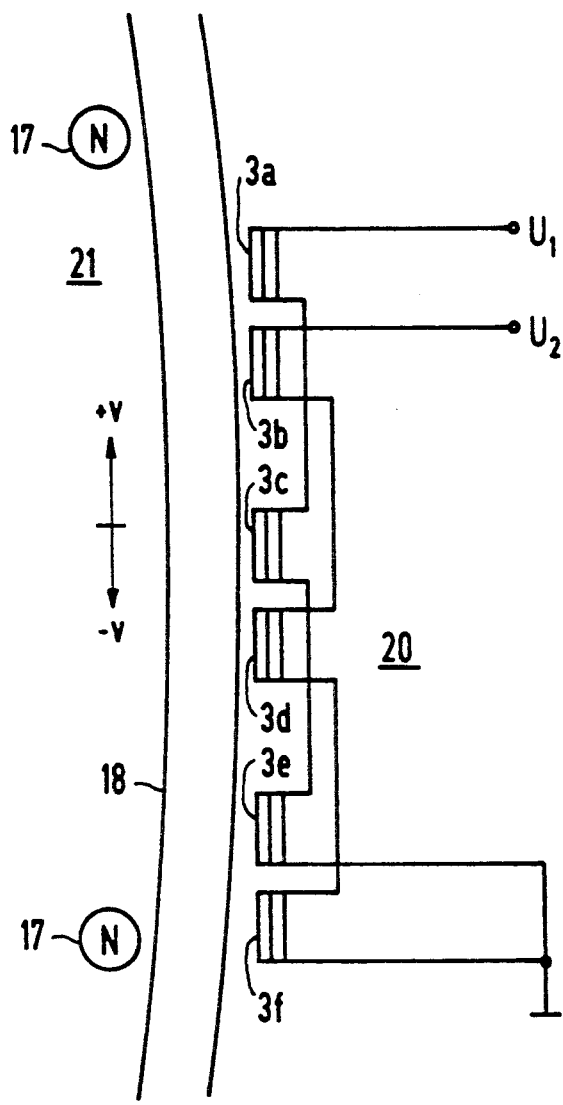
FIG. 8 is an enlarged view of a portion of a speed sensor constructed according to an alternate embodiment of the present invention.

The sensor device of the present invention can also be designed to recognize the direction of rotation in a speed sensor. Referring to FIG. 8, an enlarged portion of a speed sensor, which is similar to the one of FIG. 6, is shown. In this embodiment, the sensor device 20 of a speed sensor 21 includes six magnetic-field sensors 3a to 3f, which are interconnected to form two groups which mate in a tooth-like manner. The first group comprises the three series-connected magnetic-field sensors 3a, 3c and 3e and generates a pulse voltage $U_1$, while the second group comprises the magnetic-field sensors 3b, 3d and 3f and generates a pulse voltage $U_2$. The direction of rotation of the rotating mounting device 18 is illustrated by two arrows labelled $+v$ and $-v$.

Figure 9:
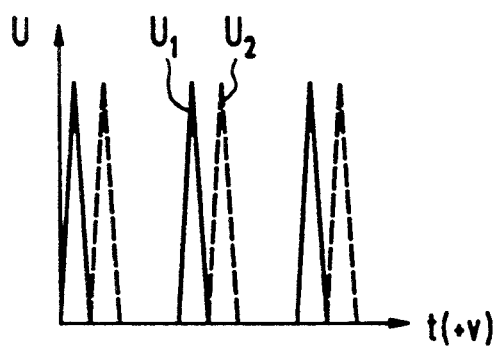
FIGS. 9 and 10 are plots of the pulse voltages generated by the speed sensor of FIG. 8.
Figure 10:
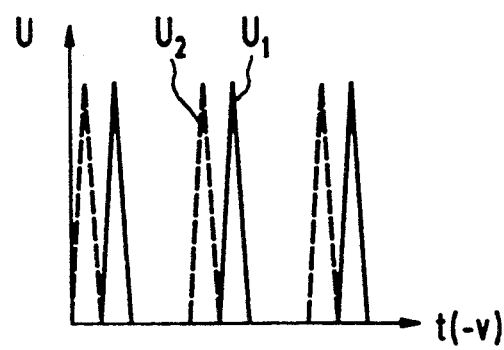

The pulse voltages $U_1$ and $U_2$ are generated depending upon the respective direction of rotation of the rotating mounting device. Diagrams of the pulse voltages for each direction of rotation are shown in FIGS. 9 and 10. The pulse voltages $U_1$ are represented by solid lines and the pulse voltages $U_2$ are represented by dotted lines. The pulse voltages of FIG. 9 result for a positive direction of rotation $+v$, while the pulse voltages of FIG. 10 are obtained for a negative direction of rotation $-v$. As can be seen from FIGS. 9 and 10, the timing sequence between the pulses $U_1$ and $U_2$ reverses depending upon the direction of rotation. This makes it possible to determine the direction of rotation.

Based on the timing sequence of the pulse voltages $U_1$ and $U_2$ as seen in FIG. 9 and 10, a sensor device 20 can be designed, as shown in FIG. 8, which can be used as a linear position encoder.

What is claimed is:

1. A magnetic-field-sensitive device comprising:
   a plurality of magnetic field sensors, wherein each of said sensors comprises:
      a compound element, said compound element including two ferromagnetic cell components, whereby each of said cell components extends in one axial direction and exhibits a uniaxial magnetic anisotropy with a preferential magnetic direction lying in said axial direction, said cell components being formed from materials having different coercive field strengths such that a spontaneous reversal of magnetization is generated by an external magnetic switching field only in said cell component having a lesser coercive field strength; and
      a coil winding surrounding said compound element, whereby said reversal of magnetization in a particular compound cell component generates a voltage pulse in the associated coil winding of said particular compound element; and
   said magnetic-field sensors are combined into at least one series arrangement, whereby said coil windings and said cell components of said magnetic-field sensors are formed as thin-film structures on a substrate of non-magnetic material.

2. The sensor device of claim 1, wherein said compound element comprises a first cell component and a second cell components, said first cell component being formed from a magnetically soft magnetic material and said second cell component being formed from a highly coercive magnetic material, and said first cell component having a coercive field strength at least five times smaller than the coercive field strength of said second cell component.

3. The sensor device of claim 2, wherein said first cell component is formed from a material having a coercive field strength less than 10 A/cm.

4. The sensor device of claim 2, wherein said first cell component is formed from a material having a coercive field strength less than 1 A/cm.

5. The sensor device of claim 2, wherein said second cell component is formed from a material having a coercive field strength greater than 50 A/cm.

6. The sensor device of claim 3, wherein said second cell component is formed from a material having a coercive field strength greater than 50 A/cm.

7. The sensor device of claim 2, wherein said second cell component is formed from a material having a coercive field strength greater than 100 A/cm.

8. The sensor device of claim 3, wherein said second cell component is formed from a material having a coercive field strength greater than 100 A/cm.

9. The sensor device of claim 5, wherein the coercive field strength of said second cell component is sufficiently large that the reversal of magnetization produced by the external magnetic switching field in the associated first cell component is nullified when the external magnetic switching field is absent.

10. The sensor device of claim 2, wherein said uniaxial magnetic anisotropy of said cell components is created by form anisotropy in said cell components of said magnetic-field sensors.

11. The sensor device of claim 2, wherein said uniaxial magnetic anisotropy of said cell components is created by diffusion anisotropy in said cell components of said magnetic-field sensors.

12. The sensor device of claim 2, wherein said uniaxial magnetic anisotropy of said cell components is created by voltage anisotropy in said cell components of said magnetic-field sensors.

13. The sensor device of claim 1, wherein said compound element is formed from a material having an absolute value of the saturation magnetostriction greater than $10^{-6}$.

14. The sensor device of claim 1, further comprising a second series arrangement of magnetic-field sensors, whereby magnetic-field sensors of said first series arrangement are positioned in an alternating series arrangement with the magnetic-field sensors of said second series arrangement.

15. The sensor device of claim 1, further comprising:
   a speed sensor device incorporating said series arrangement of magnetic-field sensors, whereby said magnetic-field sensors generate voltage pulses.

16. The sensor device of claim 1, further comprising:
   a linear position encoder incorporating said series arrangement of magnetic-field sensors, whereby said magnetic-field sensors generate voltage pulses.

17. The sensor device of claim 14, further comprising:
   a linear position encoder incorporating said one and second series arrangements of magnetic-field sensors, whereby said magnetic-field sensors generate voltage pulses.

* * * * *